United States Patent [19]

Boskamp et al.

[11] Patent Number: 5,006,803
[45] Date of Patent: Apr. 9, 1991

[54] NUCLEAR MAGNETIC RESONANCE APPARATUS WITH SURFACE COIL DETECTION

[75] Inventors: Eddy B. Boskamp; Rudolf Kemner, both of Eindhoven, Netherlands

[73] Assignee: U.S. Philips Corporation, New York, N.Y.

[21] Appl. No.: 31,064

[22] Filed: Mar. 26, 1987

Related U.S. Application Data

[63] Continuation of Ser. No. 677,939, Dec. 4, 1984, abandoned.

[30] Foreign Application Priority Data

May 25, 1984 [NL] Netherlands .................. 8401671

[51] Int. Cl.$^5$ ............................................ G01R 33/36
[52] U.S. Cl. .................................... 324/311; 324/322
[58] Field of Search .............. 324/300, 307, 309, 311, 324/318, 319, 322

[56] References Cited

U.S. PATENT DOCUMENTS

| | | | |
|---|---|---|---|
| 4,052,661 | 10/1977 | Highan et al. ................ | 324/322 |
| 4,093,911 | 6/1978 | Hill et al. ..................... | 324/322 |
| 4,129,822 | 12/1978 | Traficante .................... | 324/322 |
| 4,408,162 | 10/1983 | Egger ........................... | 324/318 |
| 4,442,404 | 4/1984 | Bergmann ..................... | 324/309 |
| 4,452,250 | 6/1984 | Chance et al. ................ | 324/311 |
| 4,467,282 | 8/1984 | Siebold ......................... | 324/309 |
| 4,580,098 | 4/1986 | Cluckstern et al. ........... | 324/318 |
| 4,620,155 | 10/1986 | Edelstein ...................... | 324/322 |
| 4,649,348 | 3/1987 | Flugan ......................... | 324/318 |

FOREIGN PATENT DOCUMENTS

| | | | |
|---|---|---|---|
| 0655029 | 1/1963 | Canada ........................... | 324/311 |
| 0873076 | 10/1981 | U.S.S.R. ......................... | 324/307 |
| 1062582 | 12/1983 | U.S.S.R. ......................... | 324/307 |

OTHER PUBLICATIONS

E. Boskamp, Application of Surface Coils in MR Imaging, Medicamundi, vol. 29, No. 2, 1984, p. 76.
K. Kisman et al., Coupling Scheme and Probe Damper for Pulsed Nuclear Magnetic Resonance Single Coil Probe, Sep. 1974, Rev. Sci. Instrum., vol. 45, No. 9.
G. Samuelson et al., Self-Switching Damping Circuit for Reducing Transmitter Ringdown Time in High Power Pulse NMR, Nov. 1970, Rev. Sci. Instrum., vol. 41, No. 11

Primary Examiner—Hezron E. Williams
Assistant Examiner—Kevin D. O'Shea
Attorney, Agent, or Firm—Jack D. Slobod

[57] ABSTRACT

For measurements with increased accuracy in a nuclear magnetic resonance apparatus, the detection device is equipped with one or more surface coils which act as measuring coils. To avoid mutual interference between a radio-frequency transmitting coil and the measuring coil, the measuring coil is provided with a decoupling circuit. The surface coil and the decoupling circuit form a part of a tuned circuit which is tuned to a significantly higher natural frequency during activation of the transmitting coil. On the other hand, the transmitting coil is shorted during detection with the surface coil by a low resistance shorting circuit, thereby avoiding interference with the radio-frequency transmission signals.

14 Claims, 3 Drawing Sheets

NUCLEAR MAGNETIC RESONANCE APPARATUS WITH SURFACE COIL DETECTION

This is a continuation of application Ser. No. 677,939 filed Dec. 04, 1984, abandoned.

BACKGROUND OF THE INVENTION

The invention pertains to nuclear magnetic resonance apparatus having a magnet system for generating a homogeneous main magnetic field ($H_O$), a magnet system for generating gradient fields, a magnet coil for generating a local homogeneous radio-frequency magnetic alternating field in an examination space and a magnet coil for detecting nuclear magnetic resonance signals generated in an object to be examined.

A nuclear magnetic resonance apparatus of this type is described in Computer Tomography, 1, 1981, pp. 2-10, and Chapter 8, page 164 of the book "Nuclear magnetic resonance and its applications to living systems" by D. G. Gadian, Clarendon Press Oxford, 1982 deals with the advantage of using a so-called surface coil for blood stream measurements. Advantages mentioned there are the relatively favourable value of the signal-to-noise ratio that can be achieved during detection, the possibility of accurate measurements in a relatively small region near the coil and the possibility of adapting the shape and size of the coil to the shape and size of an object to be measured. For generating the radio-frequency electromagnetic field, a larger coil is used, often called a body coil, because otherwise the spatial homogeneity in the field is insufficient. If it is desired in such an apparatus for one reason or another to position the transmitting coil and a surface coil as measuring coil other than mutually perpendicular, serious disturbances occur. The surface coil is then activated by the transmitting field to such an extent that the detection circuit becomes overloaded, which may for instance lead to destruction of a pre-amplifier. Conversely,, during transmission the current induced in the surface coil interferes with the radio-frequency transmission signal so that, for example, incorrect 90° and 180° transmitting pulses are produced. These effects result in a severe limitation of the possible applications of surface coils or, on the other hand, many of the advantages of the surface coil are lost due to these disturbances.

SUMMARY OF THE INVENTION

By making provisions for the surface coil, the invention aims at providing an apparatus for nuclear magnetic resonance measurements in which the surface coil can be used in all positions and orientations. To this end, an NMR apparatus of the kind mentioned in the preamble possesses in accordance with the invention the novel feature that the magnet coil for detecting the nuclear magnetic resonance signals is formed by a surface coil which is provided with an electronic decoupling circuit for decoupling the surface coil during energisation of the radio-frequency transmitting coil.

Since the surface coil in a nuclear magnetic resonance apparatus according to the invention is decoupled during the time the transmitting coil is active, no disturbing induction current will occur in it, irrespective of the mutual orientation of the transmitting coil and the measuring coil. The problems mentioned above are thus avoided.

In a preferred embodiment, the surface coil, at least during transmission by the radio-frequency transmitting coil, is turned to a frequency which is significantly higher than the operating frequency of the system. A higher frequency is favourable, as otherwise the measuring coil remains strongly current-conducting.

In a preferred embodiment, the decoupling is implemented by using a variable capacitor as C value for the tuned circuit of the surface coil. Upon decoupling the C value is lowered, as a result of which the natural frequency of the tuned circuit is increased. If a single variable capacitor, for example in the form of an electrically controllable varicap, cannot bypass the voltages that occur, it is favourable to connect several of such capacitors in series. To maintain a correct total capacitance value it is then desirable to use several capacitors in a parallel arrangement. In this way a matrix of variable capacitors is formed.

In a preferred embodiment, which is equipped with a balun connection or some other provision for symmetrical detection, the decoupling circuit is located between that connection and the ends of the actual surface coil. It is often favourable to include a high-ohmic resistor between a power source for the decoupling circuit and the actual decoupling circuit. This ensures that the Q value of the tuned circuit for the working frequency is not adversely influenced.

In another preferred embodiment the radio-frequency transmitting coil is short-circuited by a relatively small resistance during detection with the measuring coil, preferably by means of a diode bridge. The shorting circuit preferably contains for this purpose two series arrangements of a diode and a resistor. To avoid mutual interference here too, the shorting circuit and its power source are interconnected, for example by means of a bridge circuit.

Yet another preferred embodiment contains at least two identical or nearly identical surface coils, each provided with a decoupling circuit. It may be favourable here to interconnect the decoulping circuits in such a way as to produce an automatic mututal relation for activation of each of the decoupling circuits. The application of several surface coils in a single apparatus is for example favourable for eye, ear, mammary examinations and the like. Advantageous use can also be made of two surface coils for examinations of objects, for example patients, that fit with too much clearance in the transmitting coils, which, because of the need it to examine relatively corpulant patients, will be the case for most patients. The surface coils can then both be applied directly against the object under examination, and since here too a larger transmsitting coil is used for achieving a spatially homogeneous transmission field for activation of the nuclear magnetic resonance, each of the surface coils is again provided with a decoupling circuit. These circuits can again be interconnected.

BRIEF DESCRIPTION OF THE DRAWING

In the following some preferred embodiments of the invention will be described in more detail with reference to the drawings, in which.

DESCRIPTION OF THE PREFERRED EMBODIMENT

Figure 1:
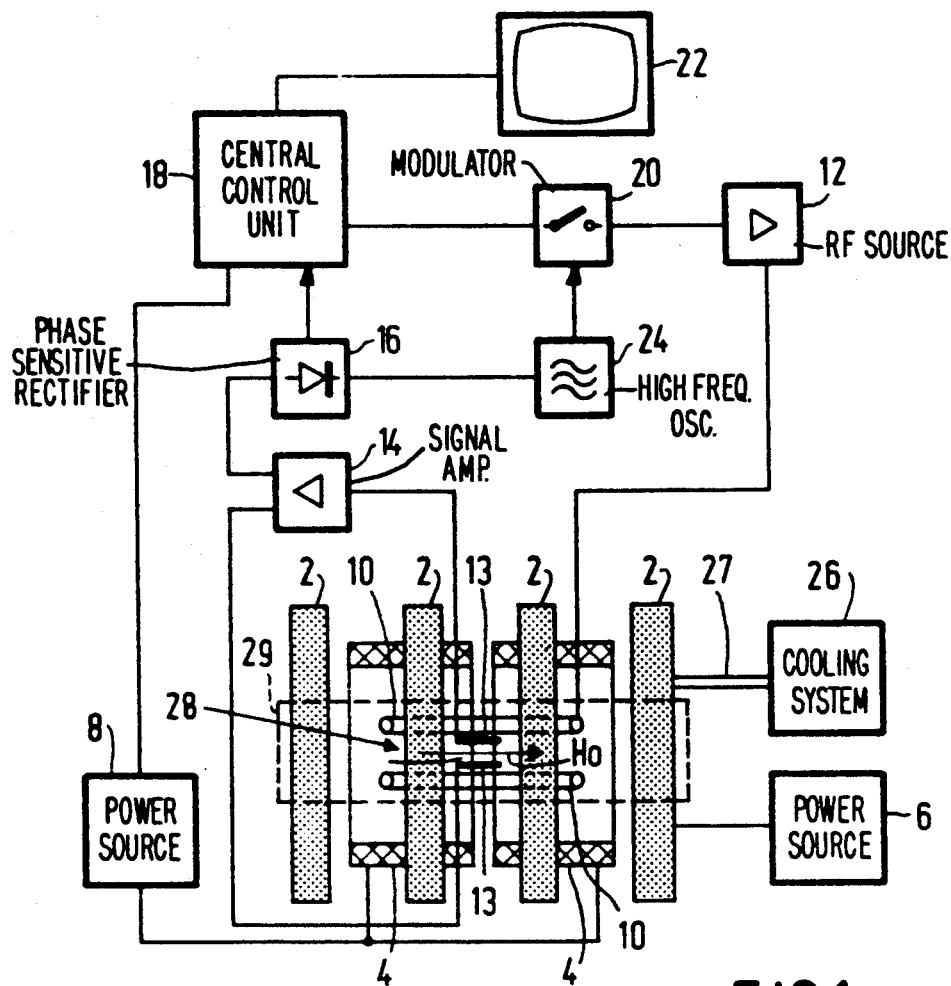
FIG. 1 shows schematically a nuclear magnetic resonance apparatus equipped with two surface coils.

A nuclear magnetic resonance apparatus as represented in FIG. 1, has a magnetic system 2 for generating a stationary honogeneous magnetic field Ho, a magnet system 4 for generating magnetic gradient fields and possibly power sources 6 and 8 for the magnet system 2 and the magnetic system respectively. A magnet coil 10 serves for generating a radio-frequency magnetic alternating field and is connected for this purpose to a radio-frequency source 12. For detection of the nuclear magnetic resonance signals generated by radio-frequency transmission field in an object under examination there are here two surface coils 13. For read-out, both coils 13 are connected to a signal amplifier 14. The signal amplifier 14 is connected to a phase-sensitive rectifier 16 which is connected to a central control system 18. The central control system 18 further controls a modulator 20 for the radio-frequency source 12, the power source 8 for the gradient coils and a monitor 22 for image display. A high-frequency oscillator 24 drives both the modulator 20 and the phase-sensitive rectifier 16 which processes the measurement signals. Where required, cooling of the magnet coils for the main field is performed by a cooling system 26 with cooling pipes 27. A cooling system of this type can be implemented as water cooling for resistance coils or as liquid helium cooling for superconducting magnet coils. The transmitting coils 10 within the magnet systems 2 and 4 enclose a measuring space 28 which, in an apparatus for medical diagnostic measurements, is roomy enough to accommodate patients within amply specified size limits. In the measuring space 28 there is thus a homogeneous magnetic field Ho, gradient fields needed for position selection of cross-sections to be displayed and a spatially homogeneous radio-frequency alternating field. The surface coils 13 are to be adjustably placed within the space 28.

Figure 6:
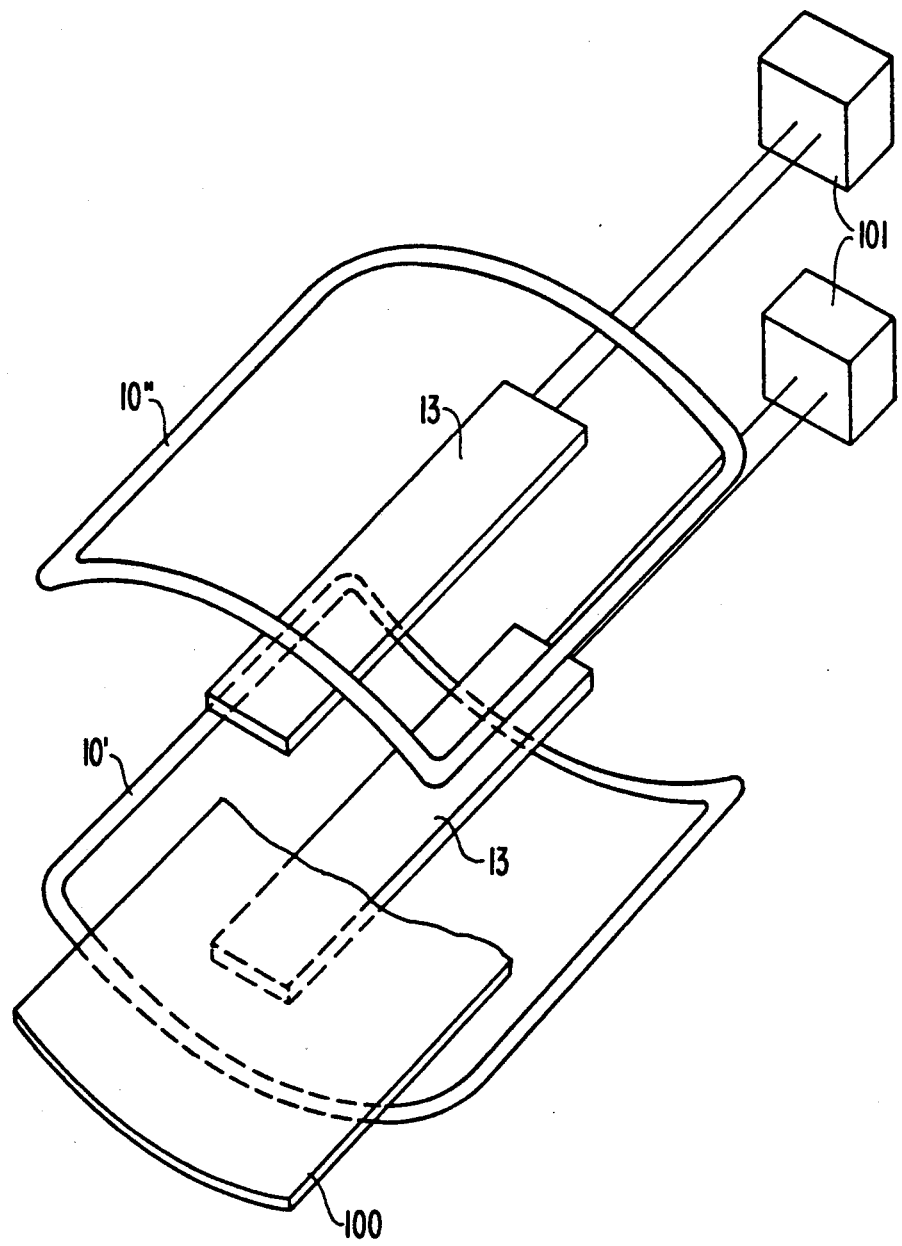
FIG. 6 shows an embodiment of the invention wherein one of the surface coils is incorporated in a table.

As shown in FIG. 6, for certain examinations such as on vertebrae and body examinations in general it is favourable to incorporate one of the coils 13 in a carrier table 100 for the patient, which carrier table should be axially displaceable and radially adjustable in the space 28 (FIG. 1). The second coil 13 can be separately introduced in such a way that it can be adapted to the body or to the part of the body under examination. Both coils 13 or, for many measurements, a single coil 13 are then usually, during the course of the examination, in fact coupled to the patient and preferably moved with the patient when the latter is repositioned. As shown in FIG.6, each of the coils 13 is connected to a decoupling circuit 101 which is hereinafter described in greater detail.

Figure 2:
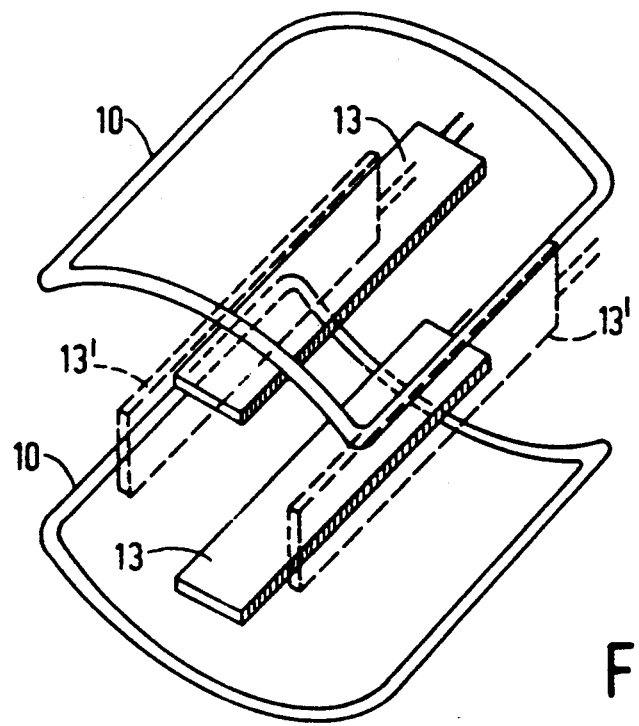
FIG. 2 shows schematically a coil system with a body coil and two surface coils.

FIG. 2 shows the transmitting coils 10 and the surface coils 13, more in perspective, in a position relative to one another. The mutual orientation sketched here will for convenience to be defined as parallel orientation, because here, due to the windings of the transmitting coils and the surface coils, certain planes move substantially parallel to one another. A position of surface coils 13', indicated by dashed lines, will be defined as perpendicular orientation. It is often only in this perpendicular orientation that no interfering induction current will be generated in the surface coils by the transmitting coils. Because part of the surfaces of the transmitting coils have the form of a cylinder sleeve because the transmitting field fans out, even here this will only be applicable to a first approximation. For many examinations the perpendicular orientation is not the most optimum, and owing to mutual interference between the transmitting and measuring coils, the scope of examination with such a set-up is significantly limited.

Figure 3:
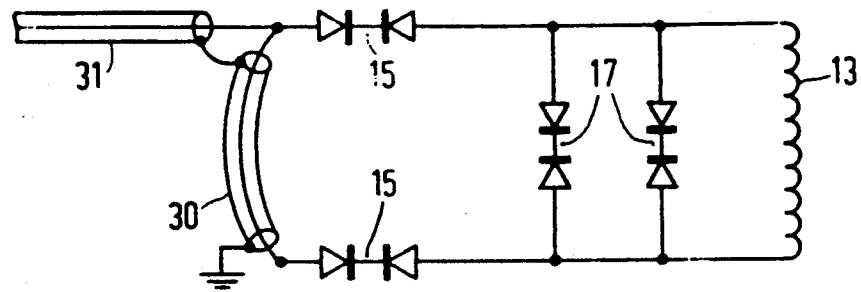
FIG. 3 shows an example of a decoupling circuit for a surface coil.

This limitation is removed with a decoupling circuit for the surface coil. FIG. 3 gives a basis circuit diagram for such a decoupling circuit. The surface coil 13 to be decoupled, together with a balun connection 30 for symmetrical drive and two variable capacitive elements 15, preferably in the form of varicaps, forms an LC tuning circuit. With the aid of variable capacitive elements 17, again preferably in the form of varicaps, this LC circuit can now be decoupled, for which purpose the capacitance of preferably all varicaps can be set to a significantly lower value. A supply lead 31 connects the whole arrangement with a read-out device, not shown here, such as the device 14 in FIG. 1.

Figure 4:
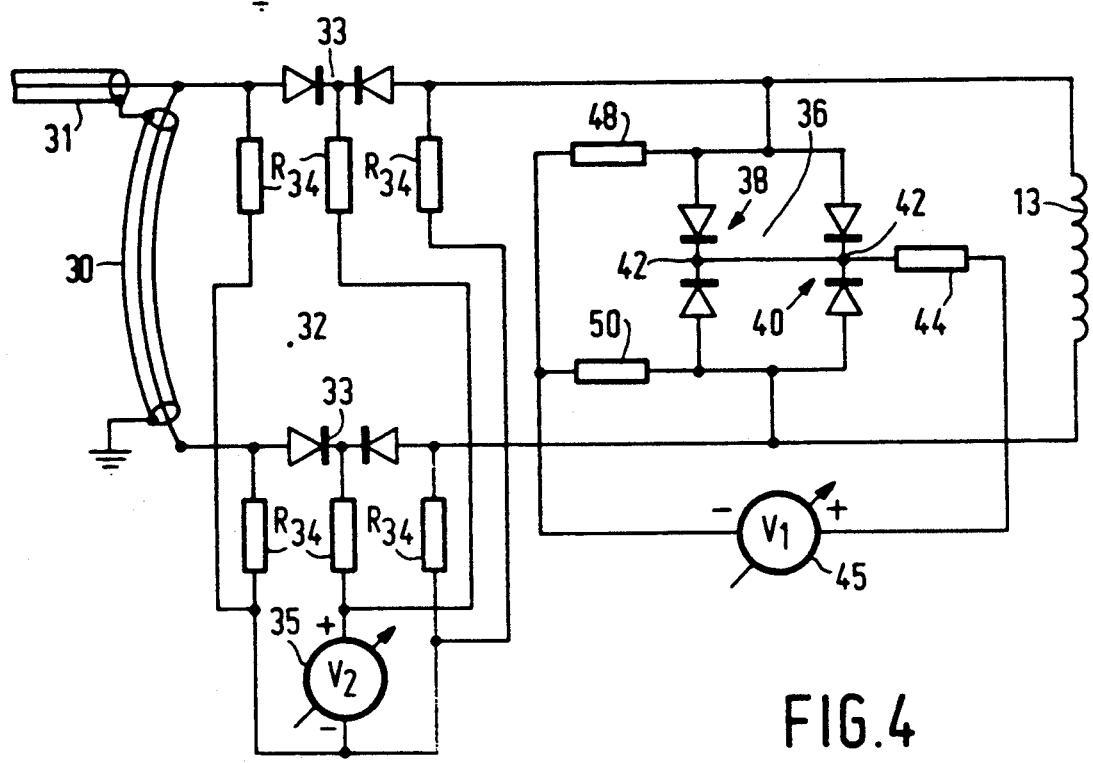
FIG. 4 shows a more detailed switching circuit with a decoupling circuit of this type.

A more detailed switching circuit shown in FIG. 4 contains the coil 13, a balun connection 30, a connector 31 and a tuning circuit 32, as described on pages 170-171 of the said book by Gadian. The circuit of FIG. 4, however, in addition also has two varicaps 33 which, via decoupling resistors 34, are connected to a power source 35. A decoupling circuit 36 has here two variable capacitors 38 and 40 whose center contacts 42 are connected via a high-frequency decoupling resistor 44 with, here, the positive pole of a power source 45. The ouptuts of the varicap 38 and 40, turned away from the center contacts 42, are each jointly connected via high-frequency decoupling resistors 48 and 50 to the negative pole of the power source 45. The two power sources 35 and 45 can be implemented as a single power source. The matching circuit, which is here equipped with varicaps 33, can also be implemented with mechanically variable capacitors, or other adjustable capacitors, but the embodiment shown here has certain advantages as regards reliability and switching speed. The resistance value of the decoupling resistors is, for example, about 500k ohms. A pre-amplifier can again be connected to the lead 31.

The decoupling circuit which, in the shown example, contains two varicaps can also be equipped with one varicap or with a matrix of several varicaps, depending on the maximum voltages expected to occur across the varicap arrangement. The supply voltage for the decoupling circuit, and here also for the matching circuit, can be adjusted with the power source 45.

Figure 5:
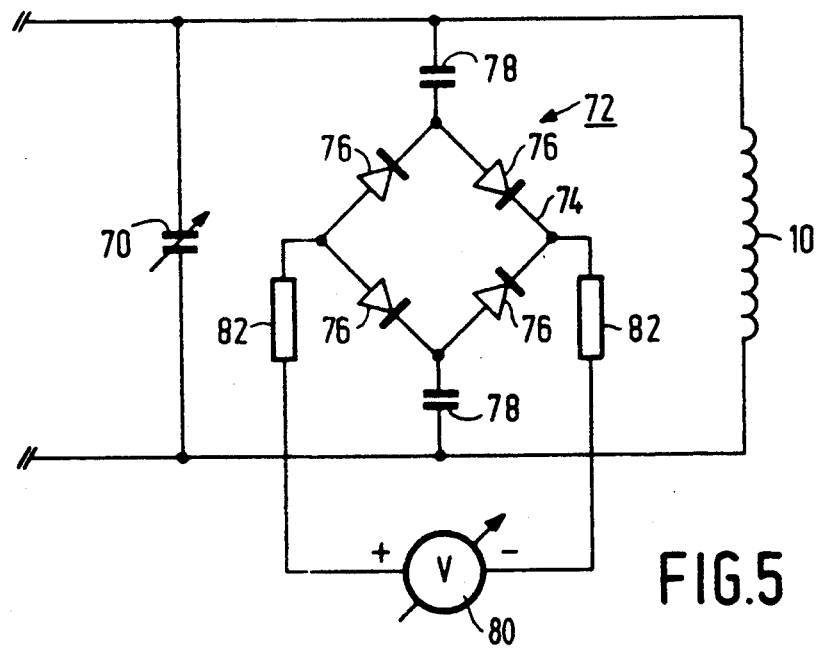
FIG. 5 shows an example of a shorting circuit for a body coil in a coil system in accordance with the invention.

During detection of the nuclear magnetic resonance signals generated in the object under examination, the transmitting coil and the measuring coil or measuring coils are all at the same frequency, called the Larmor frequency. This often gives rise to coupled resonant circuits, resulting in a lowering of the Q value and tuning problems with the measuring coils, here the surface coils. Decoupling of the transmitting coil as described in the foregoing for the measuring coils is not practical since here, owing to the relatively high voltages and high powers, use cannot readily be made of the variable capacitors, described. A solution for this is a shorting circuit as indicated in FIG. 5. The transmitting coil 10, which forms an LC circuit with a variable tuning capacitor 70, can here be controllably shorted with a shorting circuit 72 constituted by a relatively small resistance and formed by a bridge arrangement 74 of four diodes 76 and two in principle fixed, relatively large decoupling capacitors 78. The bridge network is fed from a variable power source 80 which is connected with the bridge circuit via two relatively high-ohmic decoupling resistors 82. By activation of the shorting circuit 72, at least during signal detection, the LC circuit is turned to a different natural frequency since the lower resistance value R of the coil 10 is now replaced by the impedance value $R+i_\omega L$ of the coil 10. As a result of this, the interference referred to will not occur. A further limitation of the use of surface coils, particularly for measuring larger objects, is the fact that the field of view of a surface coil is relatively restricted and does not extend much deeper than over a distance corresponding to the dimension of the coil surface. To avoid interfering effects from areas with relatively low signals, it is then desirable to pick up signals up to a distance equal to twice the size of the coil which, particularly because of the higher noise contribution, imposes a limitation on the accuracy of the measurement. When two surface coils are used as measuring coils with an object to be displayed placed between these coils, this drawback is overcome by, during transmission, decoupling one of the measuring coils and the other not, or, if that is disadvantageous for the apparatus, by only partly decoupling. The not completely decoupled measuring coil then compensates the transmission field of the transmitting coil over a distance which is again dependent on the surface area of the coil and the degree of decoupling. The strongest compensation is then obtained when the second measuring coil is not decoupled at all. During detection with the first measuring coil, which was thus completely decoupled during transmission, there is now no need to measure over an extra large distance, to the benefit both of the signal-to-noise ratio and the resolution of the measurement signals. During this detection, the second measuring coil is preferably completely decoupled and the transmitting coil short-circuited in the manner indicated. It will be evident that in this procedure the function of the two measuring coils can be changed over. The method results, without loss of spatial resolution, in a shortened measuring and reconstruction time and, as already remarked, in a better signal-to-noise ratio or, with the same measuring time, in a higher spatial resolution.

In apparatus in which, for example, both a transmitting coil for body measurements and a transmitting coil for head measurements are used, it may be favourable to add shorting circuits to these coils as well. These shorting circuits can then again be mutually coupled. In this way disturbance of the transmission signals by the coils can be avoided or at least sufficiently reduced.

In a practical example of a nuclear magnetic resonance apparatus with a superconducting magnet coil it is often the case that the noise in the measuring signal is determined by the object under measurement. For the measurement of a transversal slice of the object, the whole object is excited in the measuring space and during measurement of the slice the noise from the whole object contributes to the noise in the measuring signal. If the measurment is made not with the transmitting coil but with two surface coils which is accordance with the invention are decoupled during transmission, then only the noise from a part of the object determined by the width of this coil contributes to the noise in the measuring signal. With a body coil having the usual opening of 50 cm and a length of about 60 cm and surface coils of for example $10 \times 40$ cm$^2$ as commonly used for examinations of the spinal narrow, the volume of the object that contributes to the noise during measurement of a vertical slice can be reduced in the proportion of the coil dimension in the direction at right angles to the slice, i.e. in the ratio of 60 to 10. A similar reduction can be obtained in the measurement of a sagittal slice. Here the surface coils are positioned with a 90° rotation. Because of this, the signal-to-noise ratio for a coronal slice cannot be improved, and for these measurements the transmitting coil can then also be used as a measuring coil. The surface coils are then decoupled or possibly removed from the apparatus.

What is claimed is:

1. A nuclear magnetic resonance apparatus comprising means for generating a homogeneous main magnetic field in an examination space, means for generating gradient fields in said examination space, means, including a first coil, for generating a local, homogeneous, radio frequency magnetic field in said examination space, and means for detecting nuclear magnetic resonance signals generated in an object under examination disposed in said examination space, said detecting means comprising a measuring coil which is separate from said first coil and an electronic circuit for decoupling said measuring coil from said first coil during generation of said radio frequency field in said examination space.

2. The apparatus according to claim 1 including a balun, and wherein said circuit is incorporated between said balun and the ends of said measuring coil.

3. The apparatus according to claim 1 wherein said radio frequency magnetic field generating means includes a magnet coil and including means for shorting said magnet coil during detection of said resonant signal by said measuring coil.

4. A nuclear magnetic resonance apparatus comprising means for generating a homogeneous main magnetic field in an examination space, means for generating gradient fields in said examination space, means, including a first coil, for generating a local, homogeneous, radio frequency magnetic field in said examination space, and means for detecting nuclear magnetic resonance signals generated in an object under examination disposed in said examination space, said detecting means comprising a measuring coil which is separate from said first coil and an electronic circuit for decoupling said measuring coil from said first coil during generation of said radio frequency field in said examination space, wherein during generation of said radio frequency field in said examination space said circuit tunes said measuring coil to a natural frequency which is significantly higher than said radio frequency.

5. The apparatus according to claim 4 wherein said circuit includes at least one electrically controllable variable capacitor element.

6. The apparatus according to claim 4 wherein said circuit includes a plurality of variable capacitive elements arranged in a matrix.

7. The apparatus according to claim 4 including a balun, and wherein said circuit is incorporated between said balun and the ends of said measuring coil.

8. A nuclear magnetic resonance apparatus comprising means for generating a homogeneous main magnetic field in an examination space, means for generating gradient fields in said examination space, means, including a first coil, for generating a local, homogeneous, radio frequency magnetic field in said examination space, and means for detecting nuclear magnetic resonance signals generated in an object under examination disposed in said examination space, said detecting means comprising a measuring coil which is separate from said first coil and an electronic circuit for decoupling said measuring coil from said first coil during generation of said radio frequency field in said examination space, and wherein said measuring coil is a surface coil.

9. A nuclear magnetic resonance apparatus comprising means for generating a homogeneous main magnetic field in examination space, means for generating gradient fields in said examination space, means, including a first coil, for generating a local, homogeneous, radio frequency magnetic field in said examination space, and means for detecting nuclear magnetic resonance signals generated in an object under examination disposed in said examination space, said detecting means comprising a measuring coil which is separate from said first coil and an electronic circuit for decoupling said measuring coil from said first coil during generation of said radio frequency field in said examination space, and further including a power source for said circuit, said power source being connected to said circuit via a high resistive element which does not substantially influence the Q factor of said measuring coil.

10. A nuclear magnetic resonance apparatus comprising means for generating a homogeneous main magnetic field in an examination space, means for generating gradient fields in said examination space, means, including a first coil, for generating a local, homogeneous, radio frequency magnetic field in said examination space, and means for detecting nuclear magnetic resonance signals generated in an object under examination disposed in said examination space, said detecting means comprising a measuring coil which is separate from said first coil and an electronic circuit for decoupling said measuring coil from said first coil during generation of said radio frequency field in said examination space, wherein said first coil comprises a magnet coil and said radio frequency magnetic field generating means includes means for shorting said magnet coil during detection of said resonant signal by said measuring coil, and said shorting means includes a bridge circuit comprised of diodes connected via resistors to a power source.

11. A nuclear magnetic resonance apparatus comprising means for generating a homogeneous main magnetic field in an examination space, means for generating gradient fields in said examination space, means, including a first coil, for generating a local, homogeneous, radio frequency magnetic field in said examination space, and means for detecting nuclear magnetic resonance signals generated in an object under examination disposed in said examination space, said detecting means comprising a measuring coil which is separate from said first coil and an electronic circuit for decoupling said measuring coil from said first coil during generation of said radio frequency field in said examination space and wherein said detecting means includes two of said measuring coils which are substantially identical and two of said circuits each associated with one of said measuring coils, said circuits being interconnected and electrically controllable.

12. The apparatus according to claim 11 wherein one of said measuring coils is incorporated in a table for supporting an object under examination in said examination space and the second measuring coil is physically positioned at the opposite side of said object.

13. A nuclear magnetic resonance apparatus comprising means for generating a homogeneous main magnetic field in an examination space, means for generating gradient fields, in said examination space, means, including a first coil, for generating a local, homogeneous, radio frequency magnetic field in said examination space, and means for detecting nuclear magnetic resonance signals generated in an object under examination disposed in said examination space, said detecting means comprising a measuring coil which is separate from said first coil and an electronic circuit for decoupling said measuring coil from said first coil during generation of said radio frequency field in said examination space, wherein said circuit includes at least one electrically controllable variable capacitor element.

14. A nuclear magnetic resonance apparatus comprising means for generating a homogeneous main magnetic field in an examination space, means for generating gradient fields in said examination space, means, including a first coil, for generating a local, homogeneous radio frequency magnetic field in said examination space, and means for detecting nuclear magnetic resonance signals generated in an object under examination disposed in said examination space, said detecting means comprising a measuring coil which is separate from said first coil and an electronic circuit for decoupling said measuring coil from said first coil during generation of said radio frequency field in said examination space, wherein said electronic circuit includes a plaurality of variable capacitive elements arranged in a matrix.

* * * * *